United States Patent [19]

Izumi et al.

[11] Patent Number: 5,022,961

[45] Date of Patent: Jun. 11, 1991

[54] METHOD FOR REMOVING A FILM ON A SILICON LAYER SURFACE

[75] Inventors: Akira Izumi; Keiji Toei; Nobuatsu Watanabe; Yong-Bo Chong, all of Kyoto, Japan

[73] Assignee: Dainippon Screen Mfg. Co., Ltd., Kyoto, Japan

[21] Appl. No.: 557,550

[22] Filed: Jul. 24, 1990

[30] Foreign Application Priority Data

| Jul. 26, 1989 | [JP] | Japan | 1-195764 |
| Oct. 14, 1989 | [JP] | Japan | 1-267777 |
| Oct. 14, 1989 | [JP] | Japan | 1-267778 |

[51] Int. Cl.[5] .................. B44C 1/22; C03C 15/00; C03C 25/06
[52] U.S. Cl. ..................... 156/646; 134/3; 156/657; 156/662; 156/345
[58] Field of Search ............. 156/643, 646, 653, 657, 156/662, 345; 134/2, 3, 31, 39

[56] References Cited

U.S. PATENT DOCUMENTS

| 4,264,374 | 4/1981 | Beyer et al. | 134/3 |
| 4,746,397 | 5/1988 | Maeda et al. | 156/646 X |
| 4,749,440 | 6/1988 | Blackwood et al. | 156/657 X |
| 4,871,416 | 10/1989 | Fukuda | 156/646 X |
| 4,904,338 | 2/1990 | Kozicki | 156/646 X |

FOREIGN PATENT DOCUMENTS 62-173720 7/1987 Japan.

Primary Examiner—William A. Powell
Attorney, Agent, or Firm—Ostrolenk, Faber, Gerb & Soffen

[57] ABSTRACT

A method for removing a film on a silicon layer formed on a surface of a substrate includes the steps of: (a) placing a substrate in a reaction chamber to be isolated hermetically from the outside air, and (b) feeding anhydrous hydrogen fluoride and alcohol simultaneously into the reaction chamber. Preferably, the method further includes the step of feeding only alcohol into the reaction chamber prior to and/or subsequent to the step (b). An alcohol layer is formed on the substrate surface, whereby the film can be removed uniformly by anhydrous hydrogen fluoride. A by-product of the reaction is taken out from the system of reaction by means of the alcohol on the substrate. No by-product remains on the substrate after the reaction. Since the silicon layer after the reaction is covered with alcohol, re-growth of a native oxide film thereon is also suppressed and on ionic contamination such as fluorine remains on the substrate surface.

20 Claims, 6 Drawing Sheets

FIG.6

| NATIVE SiO₂ REMOVAL METHOD | CLEANING METHOD | $F_{1s}/Si_{2p}$ | $O_{1s}/Si_{2p}$ |
|---|---|---|---|
| a | i | 1 | 1 |
| a | ii | 1.9 | 1.9 |
| a | iii | 2.3 | 1.4 |
| a | WITHOUT CLEANING | 2.4 | 0.9 |
| b | i | 1.7 | 1.1 |
| b | ii | 3.1 | 2.7 |
| b | WITHOUT CLEANING | 5.5 | 1.5 |

METHOD FOR REMOVING A FILM ON A SILICON LAYER SURFACE

BACKGROUND OF THE INVENTION

1. Field of the Invention

The present invention relates generally to methods for removing a film formed on a surface of a silicon wafer or the like, and particularly it relates to a method for removing a film such as a native oxide film formed on a surface of a silicon wafer, a surface of a polysilicon film, or a surface of an amorphous silicon film, etc. (such surface being hereinafter referred to as "silicon layer surface") by using halide such as hydrogen fluoride (HF).

2. Description of the Related Art

In a process of manufacturing semiconductor devices, semiconductor substrates are liable to be contaminated by various factors. Such contamination adversely affects the operating characteristics of the semiconductor devices to be formed thereafter on the substrates. Such contamination decreases the yield of production of semiconductor devices. Therefore various efforts have been made to protect the silicon layer surfaces of wafers from contamination in respective steps of the manufacturing process.

A native oxide film ($SiO_2$) formed on a silicon layer surface is considered to be one of contaminants on the silicon layer surface. The native oxide film is easily formed to a thickness of 10 to 20 A on the silicon layer surface by only exposing the surface to the atmosphere. Native oxide films are also formed secondarily on silicon layer surfaces in different cleaning and etching steps in a semiconductor device manufacturing process.

For instance, it is known that electric characteristics of a thin gate oxide film of a MOSFET (Metal-Oxide Silicon Field Effect Transistor) formed on a silicon wafer are considerably affected by preliminary treatment of the silicon wafer surface. If a thin oxide film such as a gate oxide film is to be formed on a silicon wafer in a semiconductor device manufacturing process, it is necessary to remove a native oxide film in advance. Otherwise, the yield of production would be lowered.

The native oxide film not only causes the electric characteristics of the thin gate oxide film to be unstable but also exerts adverse effects as described below. In the case of a MOSFET, if a native oxide film remains on a base layer where electrodes such as a source and a drain are to be formed, the electrodes formed thereon can not perform their functions normally. If a metal electrode is formed on the silicon wafer where a native oxide film exists, contact resistance increases due to the existence of the native oxide film. In the case where a silicon crystal layer is to be formed on a substrate by epitaxial growth, the crystal layer having desired characteristics could not be obtained if a native silicon oxide film exists on the substrate surface.

Thus, special care should be taken for the native oxide film formed on the silicon wafer surface in the semiconductor device manufacturing processes. Particularly, before formation of a film by CVD (Chemical Vapor Deposition), or sputtering or the like, it is always necessary to remove the native oxide film from the wafer surface.

Various methods have been proposed and used to remove the native oxide film from the silicon wafer surface. In recent years, several methods for cleaning silicon wafer surfaces by using halide gas such as hydrogen fluoride (HF) have been studied.

One example of such methods is disclosed in "Submicron ULSI Process Technology" in papers prepared for the seventh ULSI Ultra Clean Technology Symposium, pp. 173-174 issued on July 1988 by Realize Co. Ltd. According to this method, anhydrous hydrogen fluoride gas having a very low content of water is sent into a reaction chamber using nitrogen or argon gas as a carrier gas. The hydrogen fluoride gas introduced into the reaction chamber reacts with a silicon oxide film ($SiO_2$) on a silicon wafer in the chamber, whereby the silicon oxide film is removed.

A second example is disclosed in U.S. Pat. No. 4,749,440. According to the method disclosed therein, anhydrous hydrogen fluoride gas is supplied to a silicon wafer surface together with water vapor. In the same manner as in the above-described method, the hydrogen fluoride gas reacts with the silicon oxide film on the silicon wafer surface, whereby the silicon oxide film is removed.

In the above-described examples, the native oxide film of silicon is mentioned as one of contaminants. However, the contaminants on the wafer are not limited to the native oxide film of silicon. The hydrogen fluoride used in the above-mentioned two methods also acts as a contaminant of the wafer if it remains thereon.

In a semiconductor device manufacturing process, halide such as nitrogen fluoride ($NF_3$), sulfur hexafluoride ($SF_6$), chlorine trifluoride ($ClF_3$) or chlorine ($Cl_2$) other than hydrogen fluoride is often used. The halide is used not only in the case of removing the oxide film from the wafer surface as described above but also in the case of etching a metal film such as an aluminum film formed on the wafer surface, or the surface layer itself of the wafer of another kind.

Any of the above mentioned halide is used in an active state of ions, radicals or the like. In a stage where an etching or cleaning process is terminated, ions of halogen such as fluorine or chlorine remain on the substrate surface and contaminate it.

If a device is formed on the substrate surface contaminated by the halogen ions, various defects of the device are liable to occur. For instance, a film is not formed in good condition, or the device obtained does not operate in an electrically correct manner.

Therefore, it is necessary to remove the ions remaining on the substrate surface after the etching or cleaning process. A conventional common method for removing the ionic contamination from the substrate surface is to clean the wafer surface by using high purity water (or ultrahigh purity water). Another method is disclosed in Japanese Patent Laying-Open No. 62-173720.

According to the above-mentioned laid-open application, vapor of hydrofluoric acid is supplied into a container in which a wafer is secured, so that a native oxide film on the wafer surface is removed. The hydrofluoric acid is removed from the wafer surface by vapor of high purity water also supplied into the container.

Other methods include a method for removing the ionic contamination from the substrate surface by exposing the wafer surface to ultraviolet light or applying argon ion ($Ar^+$) sputtering to the substrate surface.

Thus, various methods for protecting wafer surfaces from contamination have been studied. However, it seems difficult to say that the wafer surface can be sufficiently protected from contamination in the prior art. The conventional method for removing contamination due to formation of films or the like, from the substrate surface, have various disadvantages as described below.

Anhydrous hydrogen fluoride gas exists as an ensemble by association of two to six molecules particularly at a temperature of 80° C. or less. For instance, two molecules form an association (which is called a dimer). Consequently, reactivity between anhydrous hydrogen fluoride gas and $SiO_2$ is very low. However, if water exists together, the hydrogen fluoride is dissociated to generate fluorine ions $F^-$. The generated $F^-$ ions react on the silicon oxide film and etching reaction of $SiO_2$ proceeds.

Thus, water plays an important role in the etching reaction of $SiO_2$ with the hydrogen fluoride.

However, it is technically difficult to control the etching reaction of the silicon oxide film by the anhydrous hydrogen fluoride in an atmosphere having a very low content of water as described above.

For instance, hydrogen fluoride and silicon dioxide react according to the following formula.

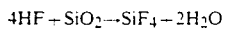
$$4HF + SiO_2 \rightarrow SiF_4 + 2H_2O$$

As is evident from the above formula, a large quantity of water is generated as a by-product as a result of the reaction. The generated water is liable to adhere to a reaction tube or a wall in the reaction chamber. In order to remove the water on the wall or the like, it is necessary to purge the reaction tube and the reaction chamber for long hours by using nitrogen gas of high purity.

Accordingly, in the case where the silicon oxide film is to be removed by using anhydrous hydrogen fluoride gas in an atmosphere having a very little quantity of water, it is difficult to control the reaction and to apply the process reliably with good repeatability.

The method described in the above-mentioned paper "Submicron ULSI Process Technology" has the following problems. This method requires a diluted gas of anhydrous hydrogen fluoride containing water of only about 0.01 ppm. It takes much time and labor to reduce the water content in the gas to such a small quantity.

On the other hand, according to the method of removing the silicon oxide film by adding water vapor to anhydrous hydrogen fluoride gas, a side reaction indicated in the following formula (1) proceeds.

$$SiO_2 + H_2O \rightarrow H_2SiO_3 \ldots \quad (1)$$

Otherwise, a reaction opposite to the etching occurs as shown in the following formula (2).

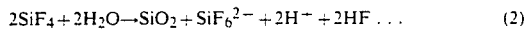
$$2SiF_4 + 2H_2O \rightarrow SiO_2 + SiF_6^{2-} + 2H^+ + 2HF \ldots \quad (2)$$

As a result of those undesired reactions, colloidal metasilicic acid $H_2SiO_3$ or silicon dioxide $SiO_2$ adheres to the wafer surface and remains thereon. The wafer surface is newly contaminated by particles of the above-mentioned substances, causing the yield of production of wafers to be lowered.

The above-mentioned methods has other problems as described below. In a semiconductor manufacturing process, steps of forming various films are performed on the silicon wafer surface. Not only a native silicon oxide film but also an insulating film such as a thermal silicon oxide film or a silicon nitride film, and so on are formed on the silicon wafer. In the above-mentioned method, even when only the native silicon oxide film is to be removed, other insulating films or the like intentionally formed on the wafer are unavoidably removed together with the native oxide film. If it is possible to selectively remove the native silicon oxide film, the semiconductor manufacturing process will be considerably simplified.

The conventional methods also involve disadvantages as described below after removal of a contaminant film from the wafer surface. As described previously, ionic contamination remains on the wafer surface. Conventionally, this contamination is commonly removed by high purity water. However, according to the above-mentioned conventional methods, if silicon Si, metal such as aluminum or the like is exposed on the substrate surface, an oxide film is liable to be formed secondarily. The oxide film so formed on the wafer surface will have to be removed by another method.

If the wafer surface is cleaned by exposure to ultraviolet light or Ar ion sputtering, the silicon wafer surface is unavoidably damaged. As a result, defects are liable to occur in the device to be formed afterwards on the wafer surface.

Thus, in the prior art, it is not possible to remove an undesired film on the silicon wafer surface with good repeatability by using halide such as anhydrous hydrogen fluoride. In addition, it is not possible to selectively remove the native oxide film, and the wafer surface after treatment can not be effectively protected from contamination.

SUMMARY OF THE INVENTION

The present invention has been accomplished to solve the above described problems, and an object of the present invention is to provide a method for removing a film formed on a silicon surface in which the removing process can be easily controlled.

Another object of the present invention is to provide a method for removing a film formed on a silicon layer, which makes it unnecessary to reduce a water content in gas to a very small quantity.

Still another object of the present invention is to provide a method for removing a film formed on a silicon layer, which makes it easy to remove water generated during reaction from a system of reaction.

An additional object of the present invention is to provide a method for removing a film formed on a silicon layer, which causes little contamination on the silicon layer due to by-products of reaction.

Another additional object of the present invention is to provide a method for removing a film formed on a silicon layer, in which an oxide film is not formed on the silicon layer after treatment.

A further object of the present invention is to provide a method for removing a film formed on a silicon layer, which makes it possible to selectively remove a native oxide film.

A still further object of the present invention is to provide a method of cleaning a substrate surface to remove, without forming any secondary oxide film on the substrate surface, contamination caused by halide remaining on the substrate surface after the substrate surface is treated by the halide using common methods.

The above-described objects can be accomplished by providing a method including the steps of: placing a substrate in a reaction chamber to be isolated hermetically from the open air, and feeding anhydrous hydrogen fluoride and alcohol simultaneously into the reaction chamber. Preferably, this method further includes the step of feeding only alcohol into the reaction chamber prior to and/or subsequent to the simultaneous feeding of anhydrous hydrogen fluoride and alcohol into the reaction chamber.

By the feeding of anhydrous hydrogen fluoride and alcohol to a silicon layer in the reaction chamber isolated hermetically from the open air, reaction indicated by the following expression occurs.

$$SiO_2(s) + 4HF(g) \rightarrow SiF_4(g) + 2H_2O(g)$$

By the reaction, silicon dioxide $SiO_2$ is removed from the surface of the silicon layer.

In this case, alcohol such as methanol, ethanol or isopropyl alcohol (IPA) is fed together with hydrogen fluoride, whereby the hydrogen fluoride is ionically dissociated to generate $F^-$ ions. The $F^-$ ions effectively react on $SiO_2$ and the above-mentioned reaction proceeds rapidly. Accordingly, $SiO_2$ is efficiently removed from the silicon layer surface.

Particularly, the alcohol such as methanol or ethanol having a small molecular weight, and water dissolve together infinitely. Water $H_2O$ generated as a by-product by the above-mentioned reaction dissolves into the alcohol. The generated water is efficiently taken out from the system of reaction and removed. As is different from the case in the method described in the above-mentioned paper "Submicron ULSI Process Technology", even if some water exists in the atmosphere, such water also dissolves into the alcohol and it is taken out and removed from the system of reaction.

Consequently, undesired side reactions as shown in the above-mentioned reaction expressions (1), (2) or a reverse reaction of etching do not occur. By-products of the reaction do not contaminate the wafer surface either. Needless to say, the above-mentioned reaction proceeds smoothly even under the atmosphere containing a very small quantity of water. As a result, controlability of the reaction is improved.

It is known that both oxygen and water are required in order to grow a native oxide film on a silicon layer surface (see for example a technical report "Shingaku Giho" Vol. 89, No. 111 of Institute of Electronics, Information and Communication Engineers of Japan pp. 11–12 ("Control of Native Si Oxide Film Formation") issued June 26, 1989 by the above-mentioned institute. According to the method of the present invention, the water quantity contained in the hydrogen fluoride and alcohol fed into the reaction chamber is suppressed to a low value. Even if alcohol is used together with anhydrous hydrogen fluoride for cleaning of a silicon wafer, the surface of the silicon wafer after treatment is hardly re-oxidized by oxygen in the atmosphere in departure from the prior art.

· The surface of the silicon wafer is cleaned by alcohol. When the removal of $SiO_2$ from the wafer surface is terminated, alcohol remains on the silicon wafer surface in the form of a layer covering the silicon wafer surface. Alcohol itself is liable to cause a reducing atmosphere and it has a very low ability of oxidation. Even if the cleaning proceeds to expose the silicon surface, the surface is protected by the alcohol and it is prevented from being re-oxidized.

The alcohol layer formed on the silicon wafer surface can be easily eliminated from the silicon wafer surface by evacuation, ultraviolet radiation, heating or other process. Thus, after-treatment can be easily performed.

According to another aspect of the invention, the concentration of anhydrous hydrogen fluoride gas occupied in the entire gas supplied to the wafer is 4 vol % or less. With this concentration, the etching reaction indicated by the above-mentioned reaction expression is not so much restrained as for the native silicon oxide film. However, as for other films such as a thermally grown silicon oxide film or an insulating film such as a silicon nitride film, the etching reaction hardly proceeds. This difference of the reactivity between the native oxide film and the insulating film was confirmed by experiments. By utilizing the difference of the reactivity, it is possible to selectively remove the native oxide film.

According to a further aspect of the invention, a method is provided for cleaning a substrate surface treated by halide, typically anhydrous hydrogen fluoride gas, in a hermetically closed reaction chamber. This method includes the steps of placing a substrate in a reaction chamber and isolating the reaction chamber from the open air; preparing anhydrous alcohol, preferably absolute methanol or absolute ethanol; and supplying the prepared anhydrous alcohol to a surface of the substrate.

When the alcohol is supplied to the substrate surface where halide, typically hydrogen fluoride, remains, the hydrogen fluoride dissolves into the alcohol. The hydrogen fluoride is solvated by alcohol molecules and removed from the substrate surface together with the alcohol.

According to this method, anhydrous alcohol is supplied to the substrate and therefore there is little water contained in the system of reaction. As described above, both oxygen $O_2$ and water $H_2O$ are required in order to grow a native oxide film on the wafer surface. Therefore, according to the present invention, there is a very little possibility that an oxide film is formed secondarily on the substrate surface compared with the conventional method of cleaning the substrate by using high purity water or vapor of water. Since the wafer surface is covered with the alcohol, oxidation of the wafer surface is prevented more effectively.

Dissolution of halide, e.g., hydrogen fluoride HF into water $H_2O$ and alcohol ROH occurs according to the following reaction expressions (J. H. Simmons, Fluorine Chemistry Vol. 1, p. 225, 1950).

$$nH_2O + 2HF \rightarrow (H_2O)_n H^+ + HF_2^- \quad \ldots (11)$$

$$ROH + 2HF \rightarrow (ROH) H^+ + HF_2^- \quad \ldots (12)$$

It is understood by comparison of the above two expressions that alcohol of 1 mole corresponds to water of n moles at the time of forming $HF_2^-$. Equivalent conductivity of hydrogen fluoride solution of methanol, ethanol or the like is larger than that of hydrogen fluoride solution of water. Therefore, hydrogen fluoride dissolves more easily than water into alcohol.

According to the method of the present invention, ionic contaminant such as fluoride or chloride is easily solvated by alcohol. Consequently, compared with the conventional cleaning method using high purity water or vapor of water, the ionic contamination can be removed from the substrate surface more efficiently. Remaining alcohol can be also removed easily from the wafer surface. Thus, it is possible to clean the wafer surface treated by halide without forming a secondary oxide film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a table showing the results of the experiments conducted in connection with the present invention.

DESCRIPTION OF THE PREFERRED EMBODIMENTS

First Embodiment

Figure 1:
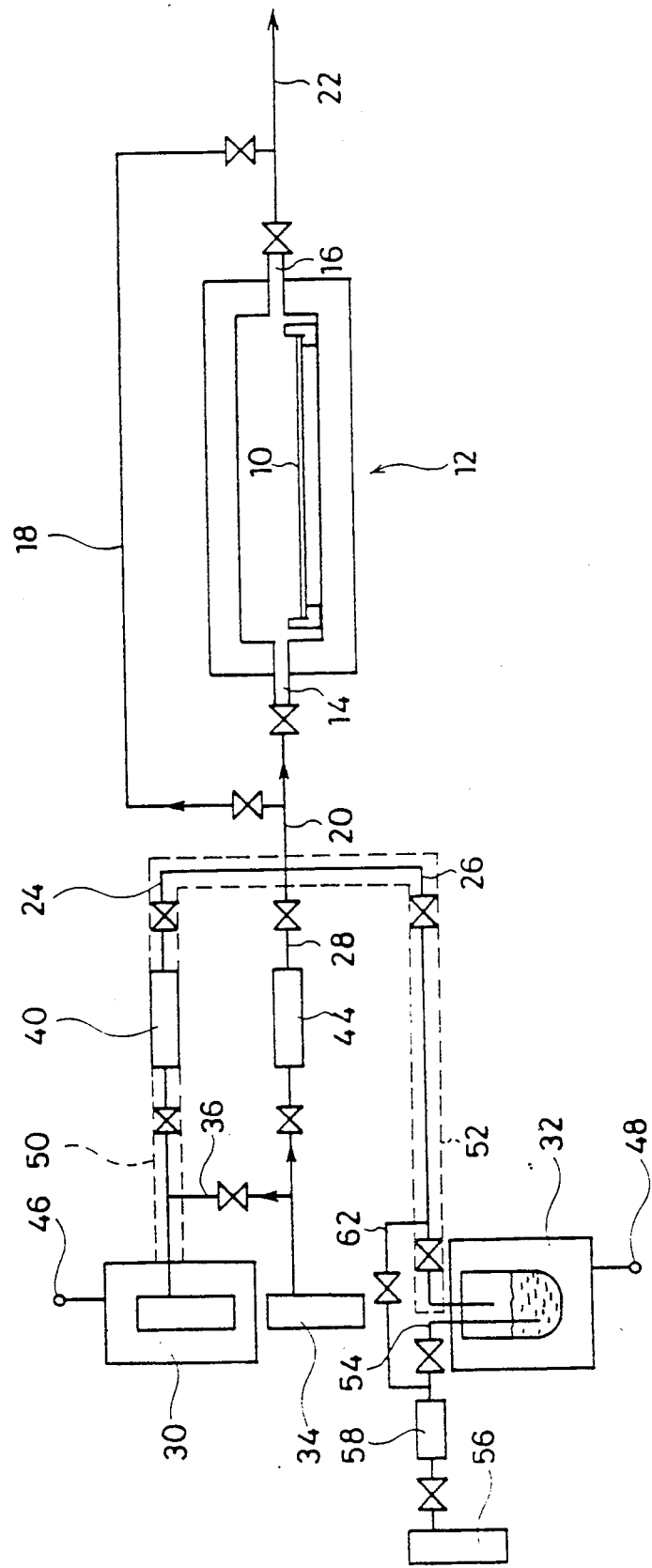
FIG. 1 is a schematic diagram showing a construction of an apparatus for applying a method according to a preferred embodiment of the present invention.

Referring to FIG. 1, an apparatus suited for applying a method according to a preferred embodiment of the present invention includes a reaction chamber 12 where a silicon wafer 10 to be subjected to treatment is contained. The reaction chamber 12 includes a gas inlet 14 through which gas or vapor is supplied, and an outlet 16. The reaction chamber 12 is formed by using Teflon (a registered trademark of polytetrafluoroethylene) and it can be isolated in an airtight manner from the outside air.

A side surface of the reaction chamber 12 has a door, not shown, through which the silicon wafer 10 is taken in and out. A load lock chamber for avoiding direct contact between the inside of the reaction chamber 12 and the outside air may be provided adjacent to the door. This serves to avoid contamination of the inside of the reaction chamber 12. The reaction chamber 12 may be connected with other process apparatus and transport lines, so as to constitute an in-line system. However, those portions are not shown in FIG. 1.

The reason that the reaction chamber 12 is formed by using Teflon is as follows. Hydrogen fluoride gas used in this method has a strong corrosiveness. Most of ordinary metals do not have resistance to hydrogen fluoride. Therefore, Teflon is used since it has particularly excellent characteristics in resistance to hydrogen fluoride, durability and processability among resins such as plastics.

The apparatus further includes a flow line 20 communicating with the inlet 14, three flow lines 24, 26, 28 joined to the flow line 20, a flow line 22 communicating with the outlet 16, and a bypass flow line 18 connecting the flow lines 20, 22 and detouring around the reaction chamber 12. The bypass flow line 18 is used to allow gas which should be supplied to the reaction chamber 12 to detour around the same until the composition of the gas becomes stable at predetermined values. The bypass flow line 18 is also used as a flow line of $N_2$ gas for purging the respective flow lines.

The flow lines 24, 28 are provided with mass flow controllers 40, 44, respectively. The flow lines 24, 26 are covered with heaters and heat insulating materials 50, 52, respectively, in order to control the temperatures of the lines.

The apparatus further includes a hydrogen fluoride source 30 connected with the flow line 24, an alcohol source 32 connected with the flow line 26, a source 34 of $N_2$ gas as a carrier gas, connected with the flow line 28, and branch flow line 36 branching from the flow line 28 and connected with the flow lines 24.

The apparatus further includes a flow line 54 introduced into alcohol in the alcohol source 32, a source 56 of $N_2$ gas as a carrier gas connected with the flow line 54, and a mass flow controller 58 provided in the flow line 54 for controlling the flow rate of $N_2$ gas. The two flow lines 26, 54 both connected to the alcohol source 32 are connected by a bypass flow line 62.

The anhydrous hydrogen fluoride source 30 and the alcohol source 32 are provided with temperature controllers 46 and 48, respectively. The amounts of supply of anhydrous hydrogen fluoride gas and carrier gas ($N_2$) are controlled by the mass flow controllers 40, 44 provided in the respective supply flow lines 24, 28. The supply amount of alcohol vapor is regulated by controlling the flow rate of nitrogen as a carrier gas by means of the mass flow controller 58 and controlling the temperature of alcohol (liquid) (accordingly, the vapor pressure of alcohol) by means of the temperature controller 48.

The heat insulating materials 50, 52 maintain the temperatures of the supply flow lines 24, 26 constant so that dew condensation may not occur in the respective supply lines of anhydrous hydrogen fluoride gas and alcohol vapor. Otherwise, it would be necessary to remove dew condensation by purging the flow lines for long hours using $N_2$ gas.

The apparatus shown in FIG. 1 has a plurality of valves provided in prescribed positions in the flow lines.

First experiment:

In connection with the first preferred embodiment, the inventors conducted the below-described experiment. In this experiment, a plurality of silicon wafers of a phosphorus-doped n conductivity type, having a resistivity of 2 to 8Ω· cm were used. The respective silicon wafers were oxidized in advance in an ozone ($O_3$) atmosphere and native oxide films of 20 Å thick were formed thereon.

In the experiment, the oxide films were removed by the method according to the present invention. The gas and reagents for cleaning used in the experiment were anhydrous hydrogen fluoride of ultrahigh purity of Showa Denko K. K., nitrogen of ultrahigh purity of Nippon Sanso K. K., methanol, ethanol, isoprophyl alcohol (IPA) of the EL grade (the highest grade for electronic industry) of Kanto Kagaku K. K. As to the water contents of the respective gases and reagents, the water content of anhydrous hydrogen fluoride was 55 ppm (with a purity of anhydrous hydrogen fluoride being 99.9925%), that of nitrogen was of the order of ppb (with the dew point of $-70°$ C. or less), and that of methanol was 500 ppm or less.

First, a silicon wafer 10 having an oxide film formed on its surface was placed in a reaction chamber 12. After the reaction chamber was closed to form a completely isolated space, N$_2$ gas of high purity was fed with a flow rate of 15 l/min into the reaction chamber through the supply flow lines 28, 20 from the nitrogen gas supply source 34 for 30 seconds. As a result, the inside of the reaction chamber 12 was purged.

The temperature of the silicon wafer 10 was regulated in the range from the room temperature to 40° C. Anhydrous hydrogen fluoride gas was fed with a flow rate of 100 to 1,000 cc/min, bubbling N$_2$ gas for generating vapor of methanol (or ethanol, or IPA) was fed with a flow rate of 500 to 7,000 cc/min, and nitrogen gas was fed with a flow rate of 0 to 5,000 cc/min into the reaction chamber 12.

Under the above-mentioned conditions, the cleaning process was effected for 30 seconds. After the cleaning process, the inside reaction chamber 12 was purged by N$_2$ gas for 30 seconds.

Results of the first experiment:

The silicon wafer 10 after the above-described cleaning process was immediately immersed in deionized water. The silicon wafer 10 repelled water completely. By this, it is understood that the native oxide film on the surface of the silicon wafer had been removed. This is because silicon per se is hydrophobic and if the native oxide film remained on the surface of the silicon wafer, the silicon wafer surface would have been hydrophilic and it would have been wet.

The silicon wafer 10 after the cleaning process was taken out from the reaction chamber 12 into the outside air and, within ten minutes, it was subjected to electron spectroscopy for chemical analysis (ESCA). The apparatus used for the ESCA measurement was ESCA 850 of Shimazu Seisakusho Ltd. As a result of the measurement, only a peak based on Si was observed in the spectrum of Si$_{2P}$, while no peak was observed in the energy position corresponding to oxide such as SiO$_2$. In other words, the peak value was less than a limit of measurement of the apparatus. As to the spectrum of O$_{1S}$, a peak which seemed to be caused by a small amount of adsorbed oxygen was observed. From these observations, it is understood that the native oxide film on the surface of the silicon wafer had been completely removed.

Second experiment:

The rate of re-oxidation of the surface of the silicon wafer 10 after the cleaning process was examined. Comparison was made between a case of wet cleaning using an agent mainly containing hydrogen fluoride HF and water H$_2$O, and a case of dry cleaning using a cleaning agent mainly containing an anhydrous HF and methanol CH$_3$OH. An ellipsometer was used in each case and change in thickness of a native oxide film versus time, in the atmosphere was examined. The results are as shown in FIG. 2.

Figure 2:
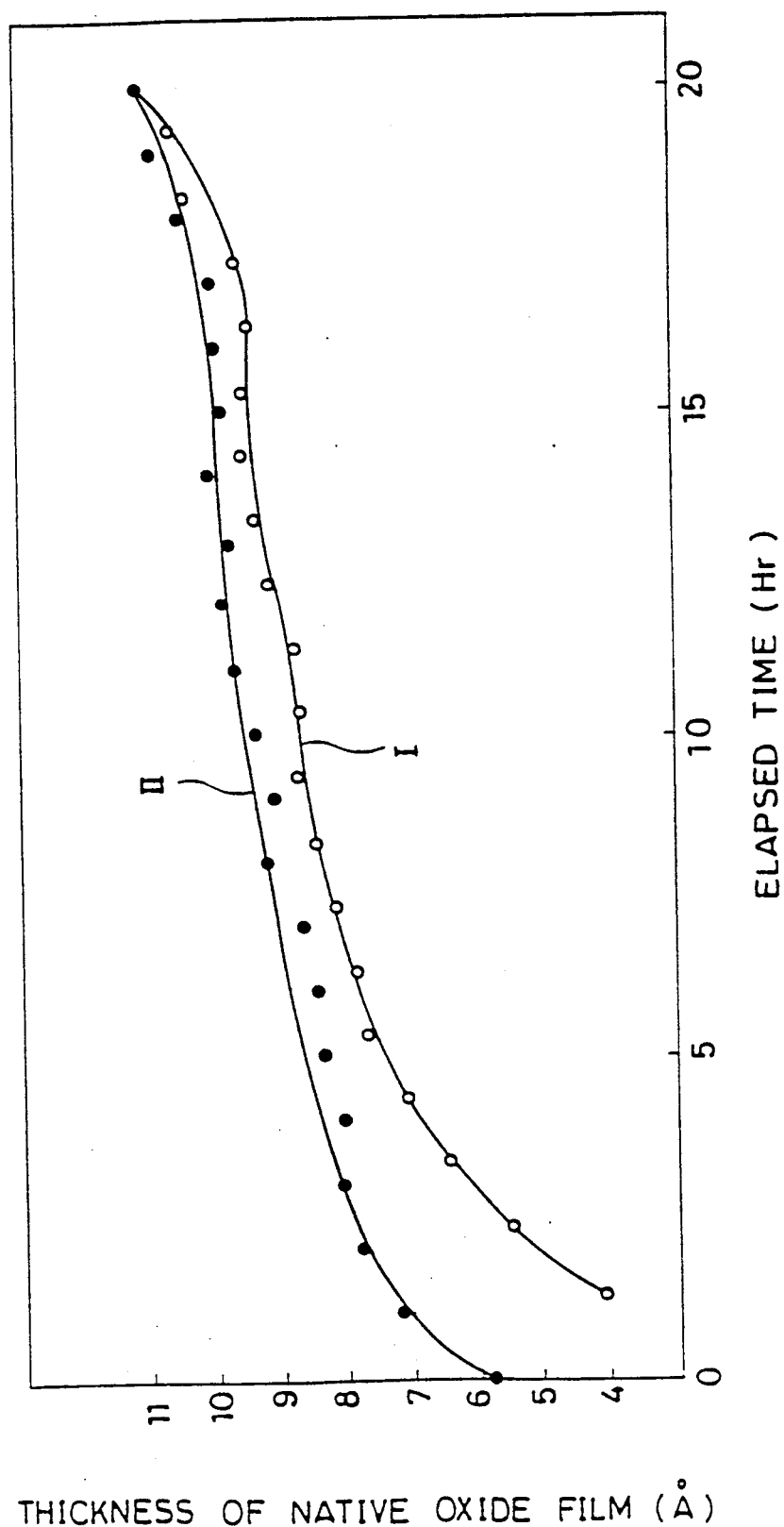
FIG. 2 is a graph showing change with time in a thickness of a native oxide film formed by re-oxidation on a silicon wafer surface after cleaning treatment.

Referring to FIG. 2, the curve I shows the change versus time in thickness of the oxide film in the case of dry cleaning using the agent mainly containing anhydrous HF—CH$_3$OH. The curve II shows the result in the case of wet cleaning using the agent mainly containing HF—H$_2$O.

In the silicon wafer 10 treated with vapor of anhydrous HF—CH$_3$OH, measurement was made after one hour and 20 minutes from the cleaning and the thickness of the native oxide film formed on the surface was only 4.1 Å. On the other hand, in the silicon wafer treated by the wet cleaning using HF—H$_2$O, the thickness of the film on the wafer surface even immediately after the cleaning was already 5.8 Å.

Thus, the native oxide film on the wafer surface treated by the vapor containing anhydrous HF—CH$_3$OH had a smaller thickness. Consequently, it is understood that better result of cleaning was obtained in the case of using the vapor of anhydrous HF—CH$_3$OH.

With regard to the change versus time in the thickness of the native oxide film, the following points can be understood clearly with reference to FIG. 2. The growth of the native oxide film on the wafer surface cleaned by the vapor of anhydrous HF—CH$_3$OH is slower than that on the wafer surface wetly cleaned by HF—H$_2$O. It is considered that the remaining CH$_3$OH on the wafer surface prevents growth of the native oxide film.

The surface of the silicon wafer 10 after the cleaning by anhydrous HF—CH$_3$OH was observed with naked eyes and by using a scanning type electronic microscope (JXA-840, a product of Nippon Densi Co. Ltd.). No contamination such as stain was observed on the wafer surface. From this result, the following conclusions can be drawn. The water H$_2$O generated secondarily by the reaction was taken out from the system of reaction together with alcohol. There was a very little amount of H$_2$O near the surface of the silicon wafer 10, and undesired side reaction or the like hardly occurred on the wafer surface.

Third experiment:

In the above-described second experiment, the ratio occupied by water (water vapor) was 0.3% or less with respect to the total quantity of anhydrous hydrogen fluoride gas, methanol vapor and nitrogen gas fed into the reaction chamber 12. In this case, the thickness of the native oxide film on the silicon wafer surface measured by using the ellipsometer one hour and 20 minutes after the cleaning was 4.1 Å as previously described.

The third experiment was conducted in the following manner. The thickness of a native oxide film on a silicon wafer surface one hour and 20 minutes after cleaning was measured. The ratio of water content with respect to the total quantity of supplied gas and vapor was set to other value higher than 0.3%, with all other conditions being the same as those in the above-mentioned second experiment.

In this experiment, the following results were obtained. With the condition of water content with respect to the total quantity of supplied gas vapor being in the range from 0.1% to 1.0%, the film thickness was 4.3 to 4.6 Å. With the condition of water content of 1.0% to 5.0%, the film thickness was 5.3 to 5.8 Å.

From this experiment, the inventors have concluded that it is not necessary to reduce the water content in the gas or vapor supplied to the system of reaction to a very small value. The reasons for the conclusion are as follows.

Although the water content was considerably changed from 0.3% to 5.0%, the film thickness was changed only by about 1.7 Å. Unless water is intentionally mixed into supplied gas, the water content of supplied gas and vapor will not have such a large value as 5.0%. Therefore, it is considered that even if the water content in supplied gas is not controlled to be a very small value, the film thickness on the wafer surface can be within a permissible range.

Fourth experiment:

The water content of methanol used in each of the above-mentioned experiments was about 500 ppm as described above. In the fourth experiment, methanol was distilled twice and the distilled methanol was bubbled by nitrogen gas under normal pressure, whereby methanol vapor was generated. The generated methanol vapor was supplied to the reaction chamber 12 wherein the silicon wafer 10 was placed, and the same experiment as described above was carried out.

In this case, the water quantity occupied in the total quantity of supplied gas and vapor was as low as 1 ppm according to the measurement by a dew-point meter because the methanol was distilled twice and the vapor pressure of alcohol is much higher than that of water under normal temperature. Thus, it was confirmed that cleaning of the silicon wafer surface can be effected smoothly even in a system of reaction including a very small quantity of water.

From the above-described first to fourth experiments, it was confirmed that the method according to the first preferred embodiment of the present invention has the below-described features. According to this method, the native oxide film on the surface of the silicon wafer 10 was completely removed (in the first experiment). The growth of the native oxide film formed on the wafer surface after the treatment is slower than that in the case of a conventional method (in the second experiment). In order to obtain the above-described effects, it is not necessary to control the water content in supplied gas to a very small value (in the third experiment). In addition, even when the water content in the system is very small, the satisfactory results were obtained (in the fourth experiment).

Therefore, according to the method of this embodiment, it is possible to remove the film on the silicon layer of the silicon wafer 10 in a satisfactory manner and to control the removing process easily.

Second Embodiment

The inventors conducted a plurality of experiments by changing compositions of supplied gases using the same apparatus as that in the first embodiment. As a result, it was found that under prescribed conditions, it is possible to selectively remove the native oxide film formed on the silicon layer.

In the following, a method of treating a surface of a substrate according to the second embodiment of the present invention will be described. The apparatus used and the respective steps are the same as those in the first embodiment. Therefore, the detailed description thereof is not repeated here.

Fifth experiment:

The first experiment described in connection with the first embodiment was conducted with different concentrations of anhydrous hydrogen fluoride gas with respect to all gases (namely, CH$_3$OH vapor, N$_2$ gas for bubbling of CH$_3$OH, anhydrous hydrogen fluoride gas and N$_2$ carrier gas). The results are shown in FIGS. 3 and 4.

Figure 3:
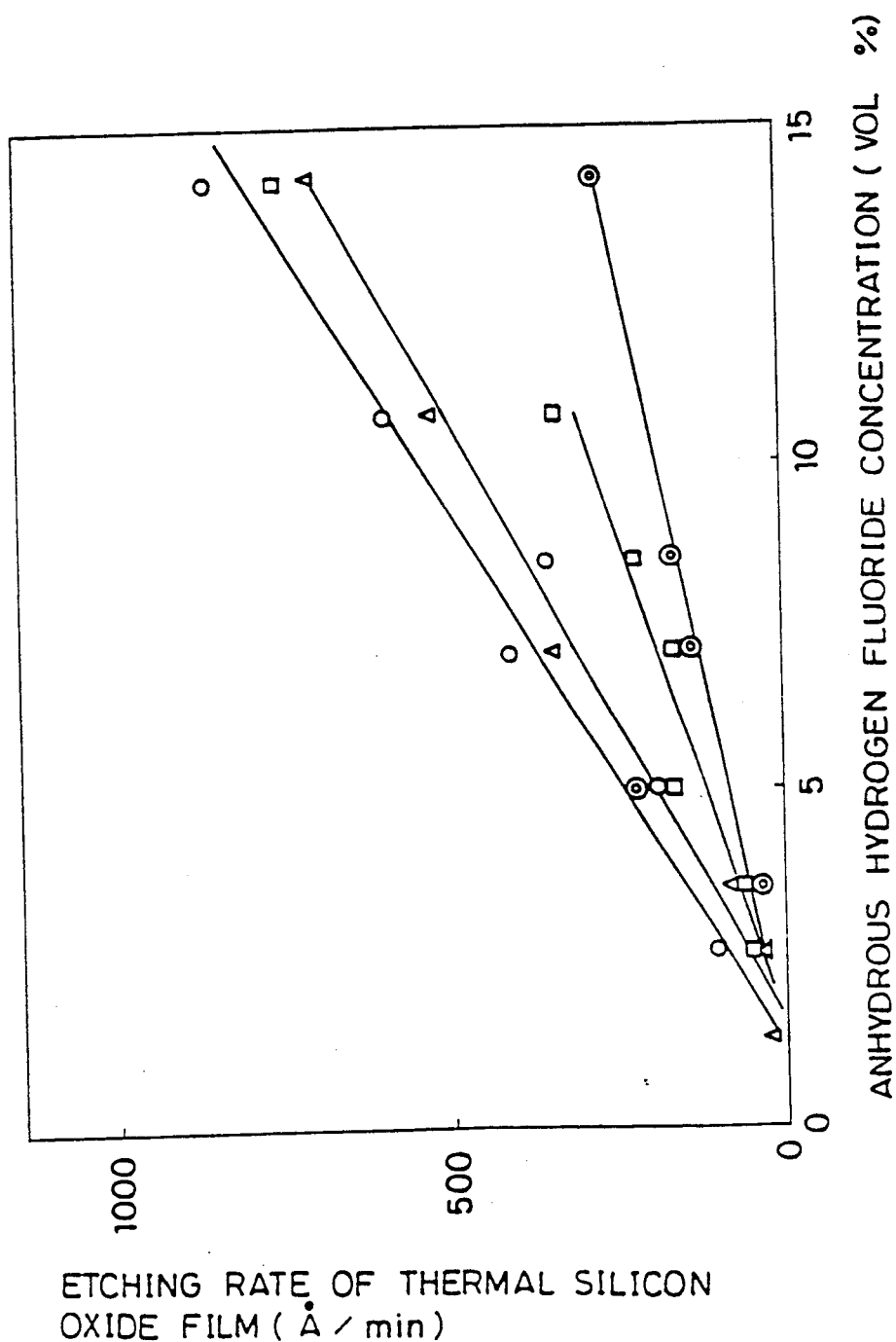
FIG. 3 is a graph showing characteristics of etching data of thermal oxide films of silicon with respect to different concentrations of anhydrous hydrogen fluoride gas.

FIG. 3 relates to etching for a thermal silicon oxide film. Referring to FIG. 3, the ordinate represents an etching rate, and the abscissa represents a concentration of anhydrous hydrogen fluorine gas. In FIG. 3, the symbols " ○ ", "△", "□" and " ◉ " represent results corresponding to different flow rates of N$_2$ gas for CH$_3$OH bubbling (those flow rates corresponding to the flow rates of CH$_3$OH since the vapor pressure of CH$_3$OH is maintained constant). The symbol " ○ " represents the case of the flow rate of N$_2$ gas for bubbling being 1,000 cc/min, the symbol "△" represents the case of the flow rate of bubbling N$_2$ gas of 1,500 cc/min, the symbol "□" represents the case of 3,000 cc/min, and the symbol " ◉ " represents the case of 4,500 cc/min.

Figure 4:
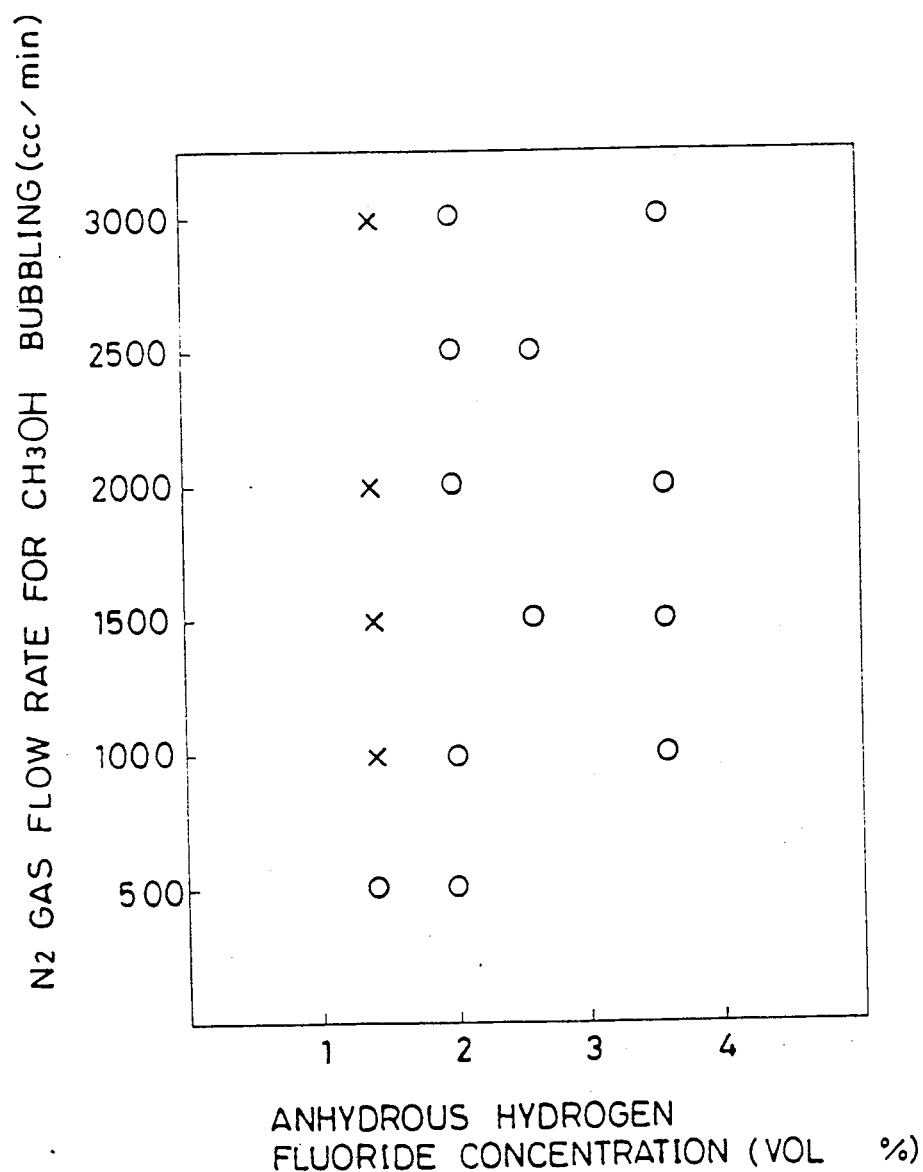
FIG. 4 is a diagram showing result of etching of a native oxide film corresponding to differences between the $N_2$ gas flow rate for methanol bubbling and the concentration of anhydrous hydrogen fluoride gas HF.

FIG. 4 relates to etching of a native silicon oxide film. Referring to FIG. 4, the ordinate represents a flow rate of N$_2$ gas for bubbling of CH$_3$OH, and the abscissa represents a concentration of anhydrous hydrogen fluoride gas. The symbols " ○ ", and "X" in FIG. 4 represent the results of the etching. The symbol " ○ " indicates the case where etching for 15 seconds made it possible to reduce the thickness of the native silicon oxide film by 7 Å or more. The symbol "X" indicates the case where it was possible to reduce the film thickness by only less than 7 Å.

In the experiments whose results are shown in FIGS. 3 and 4, the flow rate of all gases was 7 l per minute and the temperature of the gas was 25° C.

On the basis of the results shown in FIGS. 3 and 4, the inventors came to the following conclusions.

If etching was effected under the conditions of the concentration of anhydrous hydrogen fluoride gas of 2 vol/% and the flow rate of bubbling N$_2$ gas of 3,000 cc/min, the etching rate of the thermal silicon oxide film was 4 Å/min or less as can be seen from FIG. 3. This means that the thickness of the thermal silicon oxide film was reduced by only $4 \times (15/60) = 1$ Å or less by the etching of 15 seconds.

On the other hand, under the same conditions, the native oxide film was completely etched within 15 seconds as seen from FIG. 4 (shown by " ○ " in FIG. 4). Thus, a selection ratio of at least $1:7 = 1/7$ was observed between the thermal oxide film and the native oxide film.

From the above-described experiments, it was found that if anhydrous hydrogen fluoride has a low concentration, the native oxide film is more liable to be etched than the thermal silicon oxide film. For example, if the concentration of anhydrous hydrogen fluoride gas is 4 vol/% or less, selectivity of etching for the native oxide film is particularly high.

Based on the above-described experiments, the inventors formed the following conceptions. For example, as in a removal process of a native oxide film formed in a contact hole, a case occurs in which a region where a thermal oxide film is formed and a region where a native oxide film is formed exist in a mixed manner and only the native oxide film is to be removed. In such a case, it is intensely desirable to remove the native oxide film efficiently without causing damage to the thermal oxide film. Conventionally, the thermal oxide film is normally protected by masking or the like so that only the native oxide film is etched and removed. According to the present invention, the good selection ratio of 1:7 can be obtained, making it possible to selectively remove the native oxide film and making it very easy to effect the above-described process. In order to obtain this selection ratio, it is merely necessary to control and lower the concentration of anhydrous hydrogen fluoride gas, and thus the reaction can be controlled easily.

Third Embodiment

Referring again to FIG. 1, the apparatus shown in the figure includes an anhydrous hydrogen fluoride gas source 30 and a methanol vapor supply source 32 separately. The methanol vapor source 32 is provided with a flow line 54 communicating with the bubbling N$_2$ gas source 56. By regulating the mass flow controllers 40, 58, it is possible in this apparatus to supply anhydrous hydrogen fluoride gas and methanol vapor to the container 12 separately at different times. If this apparatus is used, it is possible to change the cleaning process in the following manner.

Figure 5:
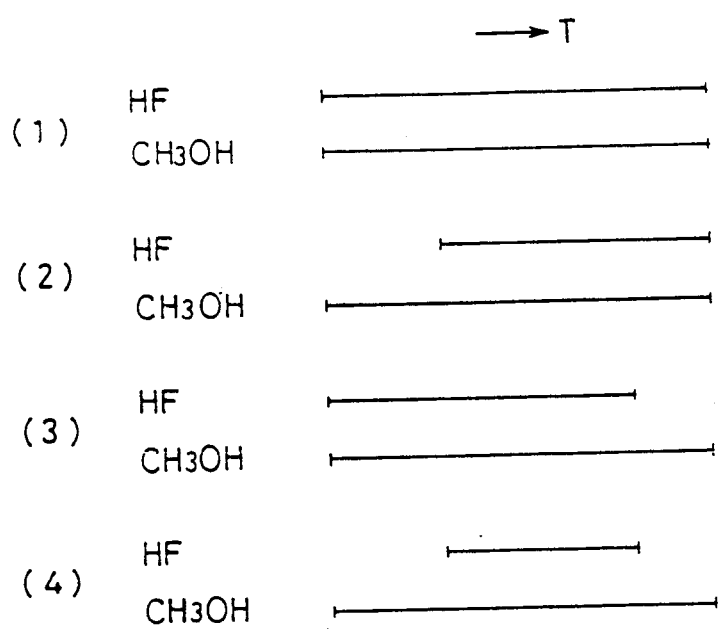
FIG. 5 is a timing chart for explaining times for feeding anhydrous hydrogen fluoride gas and methanol vapor in a method according to the present invention.

(1) According to the first method, supply of anhydrous hydrogen fluoride gas and supply of methanol vapor are started simultaneously and terminated simultaneously as shown in FIG. 5(1).

(2) According to the second method, referring to FIG. 5(2), at first a silicon wafer 10 is placed in the reaction chamber 12. The reaction chamber 12 and all the flow lines are purged by $N_2$ gas. After a prescribed elapse of time (e.g., 10 to 60 sec) from the introduction of methanol vapor into the reaction chamber 12, supply of anhydrous hydrogen fluoride gas is started. Anhydrous hydrogen fluoride gas and methanol vapor are supplied simultaneously for a prescribed period, whereby the process of cleaning the silicon wafer is performed, and the supply of anhydrous hydrogen fluoride gas and that of methanol vapor are stopped simultaneously.

(3) Referring to FIG. 5(3), according to the third method, supply of anhydrous hydrogen fluoride gas and that of methanol vapor are started simultaneously. After the process of cleaning the silicon wafer, only the supply of hydrogen fluoride gas is stopped first. Thereafter, only methanol vapor is supplied. After a suitable elapse of time (e.g., 10 to 30 sec), the supply of methanol vapor is stopped.

(4) Referring to FIG. 5(4), according to the fourth method, the process is effected in the order of start of supply of methanol vapor to the reaction chamber 12, start of supply of anhydrous hydrogen fluoride gas, stop of the supply of anhydrous hydrogen fluoride gas, and stop of the supply of methanol vapor.

The first method is the method adopted in the first to fifth experiments. Since the effects thereof have been already described, the description is not repeated here. The other methods have characteristics as described below.

According to the second method, the silicon wafer 10 having the whole surface covered with methanol vapor in advance is etched by anhydrous hydrogen fluoride gas. As a result, affinity between the oxide film on the surface of the silicon wafer 10 and the anhydrous hydrogen fluoride is increased and etching can be effected more uniformly. Even if a very small amount of organic contamination exists on the surface of the silicon wafer 10, the organic material is removed from the surface of the wafer by the methanol and is taken out from the system of reaction since the methanol vapor is supplied in advance. In consequence, the uniformity of the cleaning can be further improved.

This meritorious effect was confirmed by the experiments conducted by the inventors.

When the wafer surface was cleaned by the third method, it was confirmed from the results of the ESCA measurement that the concentration of residual fluorine on the wafer surface was further decreased. Thus, the yield of electronic devices manufactured thereafter on wafer surfaces is further increased.

The fourth method combines the second and third methods. Accordingly, it is possible to effect a stable cleaning process having the characteristics of the above mentioned two methods.

Sixth experiment:

As described previously in the section of Background of the Invention, after the cleaning process for the native oxide film on the silicon wafer surface using hydrogen fluoride or the like, halogen ions remaining on the wafer surface should be decreased to as small an amount as possible.

To this end, an experiment was conducted to obtain a method for removing effectively hydrogen fluoride from the wafer surface after the process by hydrogen fluoride.

In this experiment, silicon wafers of a phosphorus-doped n conductivity type having a resistivity of 2 to 8Å· cm were used. The silicon wafer was soaked in advance in a solution of mixture of $H_2SO_4$—$H_2O_2$ and an oxide film of 13 Å in thickness was formed on the surface thereof.

Cleaning and removal of the native oxide film on the silicon wafer surface were effected by the following two methods.

(a) First treatment method

A silicon wafer 10 was placed in the reaction chamber 12 of the apparatus shown in FIG. 1 and the chamber 12 was completely closed in an airtight manner. $N_2$ gas of high purity was fed into the reaction chamber 12 with a flow rate of 15 l/min from the nitrogen gas source 34 through the supply flow lines 28, 20, so that the inside of the reaction chamber 12 was purged for 30 seconds.

Anhydrous hydrogen fluoride gas with a flow rate of 100 to 1,000 cc/min (25° C.), bubbling $N_2$ gas with a flow rate of 500 to 5,000 cc/min (25° C.) for generating methanol vapor, and nitrogen gas with a flow rate of 0 to 5,000 cc/min (25° C.) were supplied to the reaction chamber 12. Under the above-described conditions, the cleaning process of the wafer surface was effected for 30 seconds and after the process, the inside of the reaction chamber 12 was purged by $N_2$ gas for 30 seconds.

(b) Second treatment method for comparison

A silicon wafer 10 was soaked in a 1% solution of hydrofluoric acid for 30 seconds, whereby the cleaning process of the surface of the wafer 10 was effected. After the process was terminated, the surface of the wafer 10 was blown with $N_2$ gas for 30 seconds.

Wafer Surface Cleaning After Treatment

The inventors examined removal of fluorine (ionic contamination) remaining on the silicon wafer surface by using the following three methods including the method of the present invention and two conventional methods for comparison.

(i) Method according to the present invention

After the silicon wafer 10 after the cleaning and removal process of the native oxide film is placed in the reaction chamber 12 of the apparatus shown in FIG. 1, the chamber 12 is hermetically closed. Methanol vapor with a flow rate of 4,000 to 5,000 cc/min (25° C.) of bubbling $N_2$ gas is supplied to the reaction chamber 12 for 30 seconds. After the cleaning process, $N_2$ gas is fed into the reaction chamber 12 with a flow rate of 15 /min, whereby the inside of the reaction chamber 12 is purged.

(ii) First conventional method for comparison

The silicon wafer 10 after the removal of the native oxide film is soaked in flowing water of high purity for 30 seconds, whereby the cleaning process is effected. After the cleaning process, the surface of the wafer is blown with $N_2$ gas for 30 seconds.

(iii) Second conventional method for comparison

The silicon wafer 10 after the cleaning and removal of the native oxide film is placed in a vacuum container of aluminum. While the vacuum container is evacuated to $10^{-3}$ mmHg by means of a vacuum pump, ultraviolet (UV) light is applied to the surface of the wafer for 10 minutes by means of a 290 W low-pressure mercury lamp.

Thus, by combining the two native oxide film cleaning methods (a), (b) and the three remaining fluorine cleaning methods (i), (ii), (iii), six methods of (a) (i), (a) (ii), (a) (iii), (b) (i), (b) (ii), and (b) (iii) are obtained. According to each of those combinations, the native oxide film was removed and fluorine remaining on the wafer surface was removed by cleaning, so that the condition of the removal of fluorine from the wafer surface was evaluated. However, among the above-mentioned six combinations, the combination of (b) (iii) was excluded from the experiment since it was considered to be the least effective.

The evaluation of the removal conditions was effected by measuring the amounts of fluorine and oxygen remaining on the wafer surface after the cleaning process. The amounts of fluorine and oxygen were measured by ESCA and the apparatus used for the measurement was ESCA850 of Shimazu Seisakusho Ltd.

The remaining amount of each element of fluorine or oxygen was compared by using a value obtained by dividing a peak area value of spectrum of each element by a peak area value of spectrum of $Si_{2p}$ (i.e., $F_{1S}$ peak area/$Si_{2p}$ peak area, or $O_{1S}$ peak area/$Si_{2p}$ peak area).

The reason for using the above-mentioned values for the evaluation is as follows. Among the above-mentioned three types of peak area values, the value for silicon is much larger than the other two values. Accordingly, using the value for silicon as a reference, it is possible to make relative evaluation for the respective values of fluorine and oxygen in the experiment.

Results of the experiment:

FIG. 6 shows the results of the experiment. Note that the combination of (b) (iii) among the above-mentioned combinations was not used and that the result of an experiment where the process of cleaning the wafer surface and removing remaining fluorine was not effected is also shown for comparison.

Referring to FIG. 6, the results of the experiment are shown as relative values regarding the values of $F_{1S}/Si_{2p}$ and $O_{1S}/S_{2p}$ as 1 obtained in the experiment by using the combination of (a) (i).

From the result shown in FIG. 6, the following conclusions are drawn. According to the method (i) of cleaning the surface of the silicon wafer using methanol vapor after removal of the native oxide film on the silicon wafer surface, the concentration of residual fluorine is small. Accordingly, the efficiency of removal of remaining fluorine by the method (i) according to the present invention is higher than the efficiencies of the methods (ii), (iii) for comparison. If the wafer surface after the treatment is cleaned by using the method (i) according to the present invention, it is possible to increase the yield of electronic devices to be later formed on wafer surfaces.

Another conclusion drawn from FIG. 6 is that the combination of the methods (a) and (i) makes it possible to minimize the quantity of remaining fluorine on the wafer surface. More specifically, in order to minimize the quantity of remaining fluorine on the wafer surface after the removal of the native oxide film from the wafer surface, it is necessary only to perform the following respective steps.

(1) Method (a)

The native oxide film on the silicon wafer surface is removed by using anhydrous hydrogen fluoride gas and methanol vapor.

(2) Method (i)

The surface of the silicon wafer is cleaned by methanol vapor.

Further, from the results shown in FIG. 6, the following conclusions are drawn with regard to the oxygen remaining on the silicon wafer 10. In the case of cleaning the surface of the silicon wafer 10 using methanol vapor by the method (i) after removal of the native oxide film on the surface of the silicon wafer 10 (in the combinations of (a)(i), (b)(i)), it is possible to lower the oxygen concentration on the wafer surface compared with the conventional method of removing fluorine from the silicon wafer surface by immersing the silicon wafer into high purity water (in the combination of (a)(ii), (b)(ii)) or applying ultraviolet light to the silicon wafer (in the combination of (a)(iii)). The oxygen concentration shows the quantity of oxygen contained in $SiO_2$ and accordingly it corresponds to the thickness of the silicon oxide film formed on the wafer surface. Consequently, if the native oxide film is removed from the wafer surface by the method (a) and thereafter fluorine is removed from the wafer surface by the method (i), it is possible to suppress most effectively re-growth of a native oxide film on the wafer.

Seventh experiment:

The inventors further conducted the below-described experiments in order to examine influences exerted by water existing in methanol vapor for fluorine cleaning on the efficiency of removal of fluorine and the re-oxidation of the silicon wafer surface after the cleaning process. The experiment was performed according to the following procedures using the apparatus shown in FIG. 1.

(1) The silicon wafer is removed by vapor mainly containing anhydrous $HF-CH_3OH$ (by the above-mentioned method (a)).

(2) Methanol vapor is supplied to the surface of the silicon wafer, so that fluorine remaining on the surface is washed away and removed (by the above mentioned method (i)).

(3) Water is intentionally mixed as impurities having different concentrations into methanol for fluorine cleaning.

(4) The thickness of the native oxide film caused by re-oxidation of the silicon wafer surface is measured by using an ellipsometer one hour and 20 minutes after the cleaning.

Results of the seventh experiment

As a result of the above-mentioned experiment, if the ratio of water (water vapor) was 5% or less with respect to the total quantity of methanol vapor and nitrogen gas, the efficiency of removal of fluorine hardly changed. The result obtained as for the thickness of the native oxide film on the silicon wafer surface one hour and 20 minutes after the cleaning process has been described previously as the result of the third experiment.

From those results of the experiments, it has been found that even if a small amount of water exists in the system of reaction, such existence exerts little effect on the concentration of fluorine remaining on the wafer surface after the cleaning process and the condition of re-oxidation of the silicon wafer surface.

As described above, according to the substrate surface treatment method in accordance with the present invention, it is possible to efficiently remove the native oxide film on the wafer surface. By cleaning the wafer surface by the method of the present invention before forming a thermal oxide film on the wafer surface by CVD, sputtering or the like, forming electrodes, forming a crystal layer by epitaxial growth, or forming a film by silicification or the like, it is possible to improve interfacial characteristics. Thus, it is possible to improve the yield of subsequent formation of devices on wafer surfaces.

The method according to the present invention alone is sufficiently effective. In addition, the method according to the present invention can be combined with other cleaning methods. After cleaning for the purpose of removing contamination due to other factors than the oxide film, such as organic materials, metals or particles, the method according to the present invention may be used to remove the native oxide film formed on the surface of the silicon wafer.

An example of methods in which the process after cleaning proceeds very smoothly as a result of treatment of a wafer surface by the method according to the present invention is a tungsten selection CVD method. If the wafer surface is preliminarily treated with the method according to the present invention, it is possible to obtain a good selectivity for the whole surface of the wafer when treatment by the tungsten selective CVD method is subsequently effected.

Also in the case of removing adhesive contaminant materials on surfaces of a thermal oxide film, a CVD oxide film, an oxide film formed by sputtering, and other oxide films formed by various processes, the cleaning method according to the present invention can be used very effectively. By using the method according to the present invention, thin surface layer portions of various oxide films as described above can be removed and the contaminant materials adhering to the oxide films can be removed together.

The application of the method according to the present invention is not limited to the case of removing the native silicon oxide film on the silicon wafer surface. The present invention is also applicable to removal of a native silicon oxide film formed on a surface of a polysilicon film or an amorphous silicon film. Such a polysilicon film or amorphous silicon film is not necessarily formed on the silicon wafer. Such films may be formed on various semiconductor wafers such as gallium arsenide wafers or various substrates such as glass substrates or ceramic substrates.

The application of the method according to the present invention is not limited to the removal of the native silicon oxide film on the silicon layer surface. The method according to the present invention is also applicable, for example, to etching of thermal silicon oxide films, silicon oxide films formed by other methods than thermal oxidation (e.g., a CVD method), or silicon insulating films such as silicon nitride films, phosphorus-doped glass films, boron-phosphorus-doped glass films, arsenic-doped glass films.

It is to be added for the purpose of better understanding that each of the above-mentioned glass films has a lowered melting point because it contains impurity. Consequently, in order to obtain a flat surface by reflowing a glass film layer during manufacturing of a semiconductor device, it is possible to achieve the object at a lower temperature. Such glass films are often used in a semiconductor device manufacturing process.

In the above described preferred embodiment, both anhydrous hydrogen fluoride and alcohol are supplied in vapor phase to the reaction chamber 12. However, the present invention is not limited thereto. Anhydrous hydrogen fluoride or alcohol may be sprayed on the wafer surface in the form of mist (fine liquid particles). The present invention is also applicable in the form of a vapor bath using anhydrous hydrogen fluoride and alcohol. In addition, the present invention can be applied by using the conventional wet cleaning method using a solution of mixture of hydrogen fluoride and alcohol.

In the method according to the present invention, after the native oxide film on the silicon wafer surface is removed by cleaning, the surface of the silicon wafer is exposed to methanol vapor. However, the present invention is not limited thereto. For instance, this method can be applied by steps of immersing the silicon wafer, from which the native oxide film has been removed, into alcohol, or spraying alcohol onto the surface of the silicon wafer and the like.

Furthermore, the method of using alcohol such as methanol for cleaning the wafer surface after removal of the native oxide film is generally effective for removal of oxide films. More specifically, as disclosed in the present invention, it is possible to suppress regrowth of a native oxide film on the silicon surface by cleaning the wafer surface using alcohol such as methanol, not only in the case of removing the native oxide film using hydrogen fluoride and anhydrous alcohol, but also after the native oxide film on the wafer surface has been removed by using singly a gas of anhydrous halide.

In the process of removing the native oxide film, gas of halide such as nitrogen trifluoride $NF_3$, sulfur hexafluoride $SF_6$, chlorine trifluoride $ClF_3$, or chlorine $Cl_2$ may be used in place of anhydrous hydrogen fluoride gas. In place of methanol vapor, other alcohol such as ethanol may be used. However, in such a case also, at least alcohol, and preferably the halide gas, are anhydrous as in the above-described embodiment.

Although the present invention has been described and illustrated in detail, it is clearly understood that the same is by way of illustration and example only and is not to be taken by way of limitation the spirit and scope of the present invention being limited only by the terms of the appended claims.

What is claimed is:

1. A method for removing a film on a silicon layer formed on a surface of a substrate, comprising the steps of:
   (a) placing said substrate in a reaction chamber to be isolated in an airtight manner from the outside air, and
   (b) feeding anhydrous hydrogen fluoride and alcohol simultaneously into said reaction chamber.

2. The method in accordance with claim 1, further comprising the step of
   (c) feeding only said alcohol into said chamber.

3. The method in accordance with claim 2, wherein said step (c) precedes said step (b).

4. The method in accordance with claim 2, wherein said step (c) succeeds said step (b).

5. The method in accordance with claim 4, further comprising the step of feeding only said alcohol into said reaction chamber prior to said step (b).

6. The method in accordance with claim 1, wherein quantities of said hydrogen fluoride and said alcohol to be fed in said step (b) are selected such that a volume percentage of said hydrogen fluoride with respect to the sum of volumes of said hydrogen fluoride and said alcohol is 4% or less.

7. The method in accordance with claim 1, further comprising the step of purging said reaction chamber by inert gas prior to said step (a).

8. The method in accordance with claim 7, wherein said inert gas includes nitrogen gas.

9. The method in accordance with claim 4, wherein said alcohol includes anhydrous alcohol.

10. A method for cleaning a surface of a substrate treated by using halide in a hermetically closable reaction chamber, comprising the steps of:
(a) transporting said substrate into said reaction chamber and isolating said reaction chamber from the outside air,
(b) preparing anhydrous alcohol, and
(c) supplying said prepared anhydrous alcohol to the surface of said substrate.

11. The method in accordance with claim 10, wherein said halide includes anhydrous hydrogen fluoride gas.

12. The method in accordance with claim 10, wherein said anhydrous alcohol includes methanol.

13. The method in accordance with claim 10, wherein said step (b) comprises the steps of:
(d) preparing said anhydrous alcohol in liquid phase, and
(e) vaporizing said anhydrous alcohol in liquid phase.

14. The method in accordance with claim 13, wherein said step (e) comprises the steps of:
(f) preparing inert gas for at least said surface of said substrate, and
(g) producing mixture gas of said inert gas and vapor of said anhydrous alcohol.

15. The method in accordance with claim 14, wherein said step (g) comprises the step of introducing said inert gas into said anhydrous alcohol in liquid phase to effect bubbling said inert gas therethrough.

16. The method in accordance with claim 15, wherein said inert gas includes nitrogen gas.

17. The method in accordance with claim 16, wherein the mixture of said nitrogen gas and the vapor of anhydrous alcohol contains water vapor of 5% at most in volume.

18. The method in accordance with claim 14, wherein said step (c) comprises the step of continuously feeding said mixture into said reaction chamber and removing said mixture from said reaction chamber.

19. The method in accordance with claim 10, further comprising the step of purging said reaction chamber by using gas which is inert at least to said substrate.

20. The method in accordance with claim 19, wherein said gas includes nitrogen gas.

* * * * *

UNITED STATES PATENT AND TRADEMARK OFFICE
CERTIFICATE OF CORRECTION

PATENT NO. :  B1 5,022,961
DATED      :  May 27, 1997
INVENTOR(S):  Akira IZUMI, et al.

It is certified that error appears in the above-indentified patent and that said Letters Patent is hereby corrected as shown below:

Column 2, line 12, for "rection", read -- reaction --.

Signed and Sealed this

Sixteenth Day of September, 1997

Attest:

BRUCE LEHMAN

*Attesting Officer*   *Commissioner of Patents and Trademarks*

REEXAMINATION CERTIFICATE (3205th)

United States Patent [19]

Izumi et al.

[11] B1 5,022,961
[45] Certificate Issued May 27, 1997

[54] METHOD FOR REMOVING A FILM ON A SILICON LAYER SURFACE

[75] Inventors: Akira Izumi; Keiji Toei; Nobuatsu Watanabe, 1-1 Tenjinkitamachi, Teranouchi-Agaru 4-Chome, Horikawa-Dori, Kamikyo-Ku 602; Yong-Bo Chong, all of Kyoto, Japan

[73] Assignees: Dainippon Screen Mfg., Co., Ltd.; Nobuatsu Watanabe, both of Kyoto, Japan; a part interest

Reexamination Request:
No. 90/004,193, Mar. 26, 1996

Reexamination Certificate for:
Patent No.: 5,022,961
Issued: Jun. 11, 1991
Appl. No.: 557,550
Filed: Jul. 24, 1990

[30] Foreign Application Priority Data

Jul. 26, 1989 [JP] Japan ............... 1-195764
Oct. 14, 1989 [JP] Japan ............... 1-267777
Oct. 14, 1989 [JP] Japan ............... 1-267778

[51] Int. Cl.$^6$ ............... B44C 1/22; C03C 15/00; C03C 25/06
[52] U.S. Cl. ............... 156/646.1; 134/3; 156/657.1; 156/662.1; 156/345
[58] Field of Search ............... 156/646.1, 657.1, 156/662.1; 216/57, 58; 134/31, 39, 2, 3

[56] References Cited

U.S. PATENT DOCUMENTS

| | | | |
|---|---|---|---|
| 4,264,374 | 4/1981 | Beyer et al. | 134/3 |
| 4,746,397 | 5/1988 | Maeda et al. | 156/646 X |
| 4,749,440 | 6/1988 | Blackwood et al. | 156/657 X |
| 4,871,416 | 10/1989 | Fukuda | 156/646 X |
| 4,900,395 | 2/1990 | Syverson et al. | 156/646 X |
| 4,904,338 | 2/1990 | Kozicki | 156/646 X |
| 5,100,495 | 3/1992 | Ohmi et al. | 56/646.1 |
| 5,112,437 | 5/1992 | Watanabe et al. | 156/646.1 |

FOREIGN PATENT DOCUMENTS

| | | |
|---|---|---|
| 61-101032 | 5/1985 | Japan . |
| 61-148820 | 7/1986 | Japan . |
| 62-143428 | 6/1987 | Japan . |
| 62-165937 | 7/1987 | Japan . |
| 62-272541 | 11/1987 | Japan . |
| 63-19825 | 1/1988 | Japan . |
| 63-56921 | 3/1988 | Japan . |
| 63-107120 | 5/1988 | Japan . |

OTHER PUBLICATIONS

North–Holland Physics Publishing Division of Elsevier Science Purchasers P.V., Amsterdam, Grunthaner & Grunthaner (Nov. 1986), pp. 65–160.

Wolf, Silicon Processing for the VLSI Era, vol. 1, Lattice Press, 1986, pp. 532–534.

*Primary Examiner*—William A. Powell

[57] ABSTRACT

A method for removing a film on a silicon layer formed on a surface of a substrate includes the steps of: (a) placing a substrate in a reaction chamber to be isolated hermetically from the outside air, and (b) feeding anhydrous hydrogen fluoride and alcohol simultaneously into the reaction chamber. Preferably, the method further includes the step of feeding only alcohol into the reaction chamber prior to and/or subsequent to the step (b). An alcohol layer is formed on the substrate surface, whereby the film can be removed uniformly by anhydrous hydrogen fluoride. A by-product of the reaction is taken out from the system of reaction by means of the alcohol on the substrate. No by-product remains on the substrate after the reaction. Since the silicon layer after the reaction is covered with alcohol, re-growth of a native oxide film thereon is also suppressed and on ionic contamination such as fluorine remains on the substrate surface.

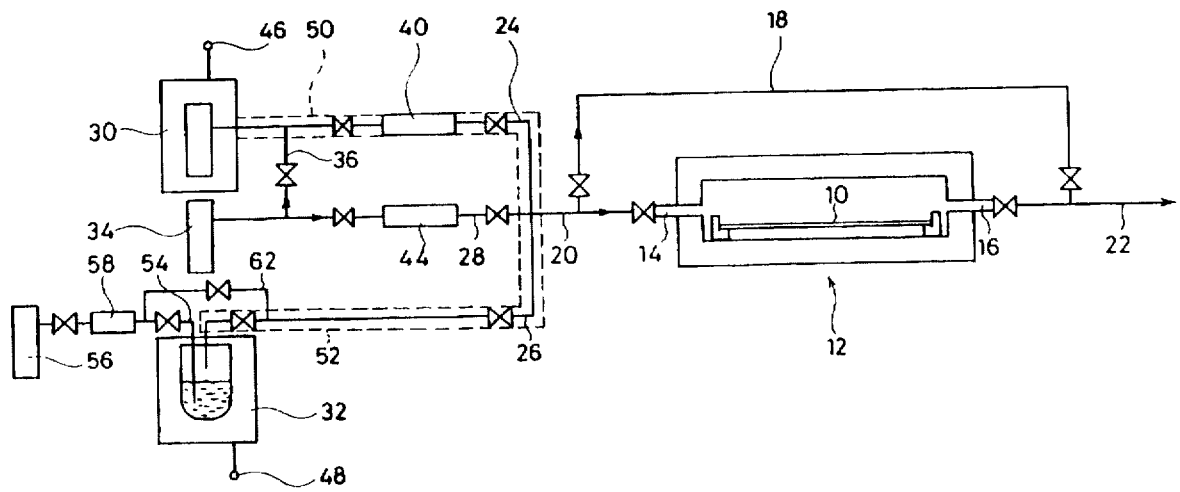

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 10 are determined to be patentable as amended.

Claims 2–9 and 11–20, dependent on an amended claim, are determined to be patentable.

1. A method for removing a film on a silicon layer formed on a surface of a substrate, comprising the steps of:

(a) placing said substrate in a reaction chamber to be isolated in an airtight manner from the outside air; [and]

(b) *isolating said reaction chamber from the outside air; and*

(c) feeding anhydrous hydrogen fluoride *gas* and alcohol vapor simultaneously into said reaction chamber *to thereby remove said film from said silicon layer by vapor phase contact with said hydrogen fluoride gas and alcohol vapor.*

10. A method for cleaning a surface of a substrate treated by using halide in a hermetically closable rection chamber, comprising the steps of:

(a) transporting said *halide-treated* substrate into said reaction chamber and isolating said reaction chamber from the outside air;

(b) preparing anhydrous alcohol *vapor*; and (c) supplying said prepared anhydrous alcohol *vapor* to the surface of said *halide-treated* substrate *to thereby remove halide on said halide-treated substrate surface by vapor phase contact with said alcohol vapor.*

* * * * *